United States Patent
Ware et al.

(10) Patent No.: US 9,007,862 B2
(45) Date of Patent: Apr. 14, 2015

(54) REDUCING MEMORY REFRESH EXIT TIME

(71) Applicant: Rambus Inc., Sunnyvale, CA (US)

(72) Inventors: Frederick A. Ware, Los Altos Hills, CA (US); Brent Haukness, Monte Sereno, CA (US); Ian P. Shaeffer, Los Gatos, CA (US); James E. Harris, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/938,130

(22) Filed: Jul. 9, 2013

(65) Prior Publication Data

US 2014/0016423 A1    Jan. 16, 2014

Related U.S. Application Data

(60) Provisional application No. 61/671,035, filed on Jul. 12, 2012.

(51) Int. Cl.
| | |
|---|---|
| *G11C 7/00* | (2006.01) |
| *G11C 11/406* | (2006.01) |
| *G11C 7/10* | (2006.01) |

(52) U.S. Cl.
CPC ............... *G11C 7/00* (2013.01); *G11C 7/1009* (2013.01); *G11C 11/40611* (2013.01); *G11C 11/40615* (2013.01); *G11C 11/40622* (2013.01)

(58) Field of Classification Search
USPC ................................................. 365/222, 236
See application file for complete search history.

(56) References Cited

U.S. PATENT DOCUMENTS

| | | | |
|---|---|---|---|
| 5,208,779 A | 5/1993 | Walther et al. | |
| 5,446,696 A | 8/1995 | Ware et al. | |
| 6,310,814 B1 | 10/2001 | Hampel et al. | |
| 7,953,921 B2 | 5/2011 | Walker et al. | |
| 2005/0105357 A1* | 5/2005 | Oh | 365/222 |
| 2006/0114735 A1* | 6/2006 | Takahashi | 365/222 |
| 2006/0274591 A1* | 12/2006 | Fujioka et al. | 365/222 |
| 2011/0055671 A1 | 3/2011 | Kim et al. | |
| 2011/0246713 A1 | 10/2011 | Bains | |
| 2011/0252193 A1 | 10/2011 | Bains et al. | |

OTHER PUBLICATIONS

CAN, Ramazan et al., "Save Power and Improve Efficiency in Virtualized Environment of Datacenter by Right Choice of Memory", Microsoft Technology Center & Samsung Semiconductor, Whitepaper, Revision: 2.1, May 2011. 10 Pages.

* cited by examiner

*Primary Examiner* — Hoai V Ho
(74) *Attorney, Agent, or Firm* — Fenwick & West LLP

(57) ABSTRACT

Components of a memory system, such as a memory controller and a memory device, that reduce delay in exiting self-refresh mode by controlling the refresh timing of the memory device. The memory device includes a memory core. An interface circuit of the memory device receives an external refresh signal indicating an intermittent refresh event. A refresh circuit of the memory device generates an internal refresh signal indicating an internal refresh event of the memory device. A refresh control circuit of the memory device performs a refresh operation on a portion of the memory core responsive to the internal refresh event, at a time relative to the intermittent refresh event indicated by the external refresh signal.

18 Claims, 7 Drawing Sheets

REDUCING MEMORY REFRESH EXIT TIME

CROSS REFERENCE TO RELATED APPLICATIONS

This application claims priority from U.S. Provisional Application No. 61/671,035 entitled "Reducing Memory Refresh Exit Time" and filed on Jul. 12, 2012, the contents of which is incorporated by reference herein in their entirety.

BACKGROUND

Memory systems can spend a significant amount of time in self-refresh mode. During self-refresh mode, the memory controller is placed into a low power state and data stored in the memory devices is periodically self-refreshed by the memory devices. Operating in a self-refresh mode reduces the power consumed by the memory system without losing data stored in the memory system. However, delays associated with exiting self-refresh mode can reduce the performance of the memory system.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Embodiments of the present disclosure relate to components of a memory system, such as a memory controller, memory modules and memory device, which reduce delay in exiting self-refresh mode by controlling the refresh timing of the memory device. In one embodiment, the memory device includes a memory core. An interface circuit of the memory device receives an external refresh signal indicating an intermittent refresh event. A refresh circuit of the memory device generates an internal refresh signal indicating an internal refresh event of the memory device. A refresh control circuit of the memory device performs a refresh operation on a portion the memory core responsive to the internal refresh event, at a time relative to the intermittent refresh event indicated by the external refresh signal. Refreshing the memory core at times that are under control of the external refresh signal is beneficial, for example, for reducing the refresh exit latency of the memory device.

In one embodiment, the external refresh signal indicates a plurality of intermittent refresh events and the internal refresh signal indicates a plurality of internal refresh events. The refresh control circuit performs refresh operations on respective portions of the memory core for each of the plurality of internal refresh events. Each refresh operation is performed at a respective time relative to a respective one of the intermittent refresh events that next follows a respective one of the internal refresh events.

In one embodiment, the memory controller includes a control circuit to generate an external refresh signal indicating an intermittent refresh event. An interface circuit of the memory controller transmits the external refresh signal to a memory device that includes a memory core. The memory device also generates an internal refresh signal indicating an internal refresh event of the memory device. The external refresh signal causes the memory device to perform a refresh operation on a portion of the memory core responsive to the internal refresh event, at a time relative to the intermittent refresh event indicated by the external refresh signal.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

Figure 1A:
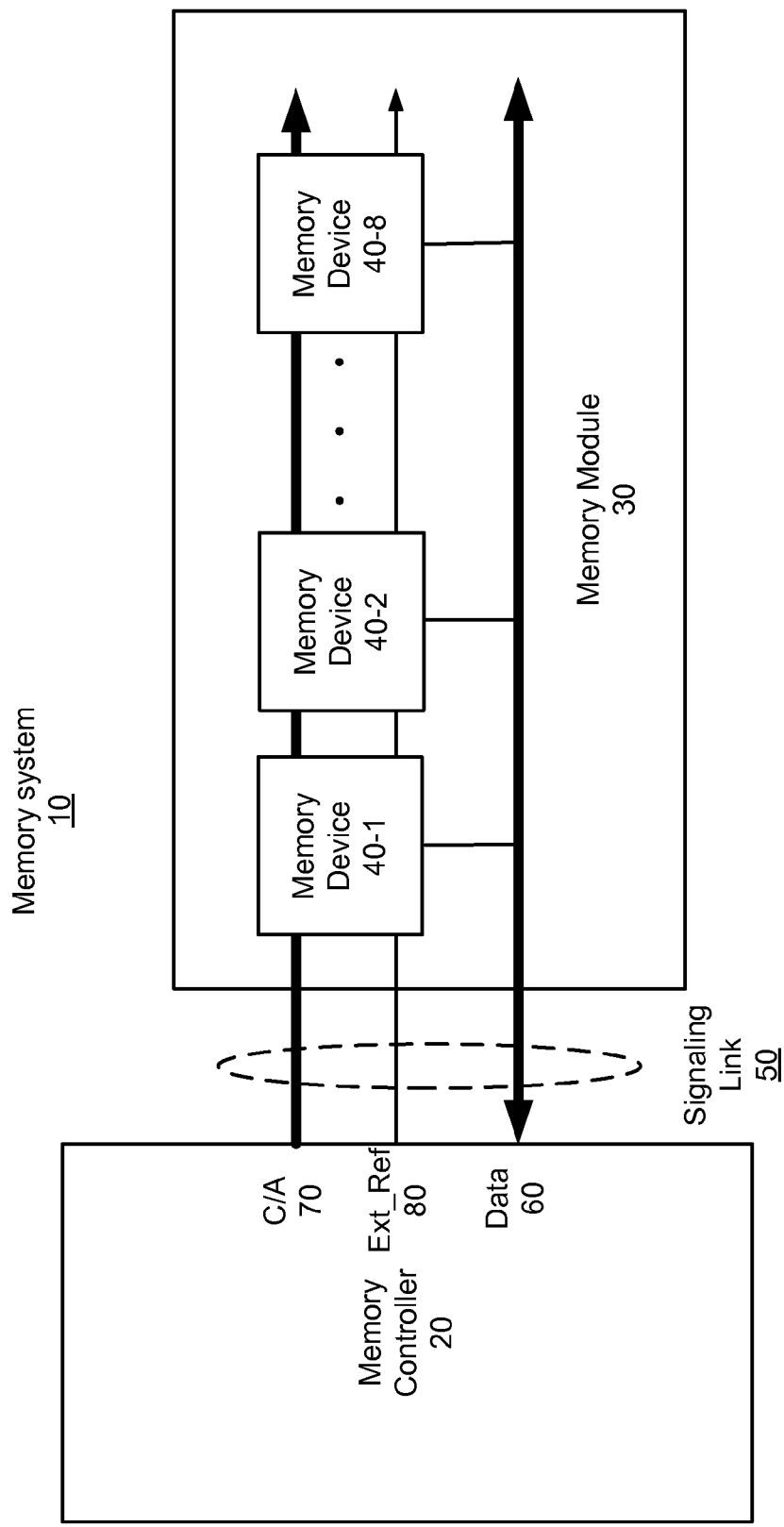
FIG. 1A is a memory system for controlling refresh timing, according to an embodiment.

FIG. 1A is a memory system 10 for controlling refresh timing, according to one embodiment. The memory system 10 includes a memory controller 20 and a memory module 30 interconnected via a signaling link 50. In one embodiment, the memory controller 20 is an integrated circuit (IC) chip that is capable of controlling memory devices 40-X. Examples of a memory controller 20 include a central processing unit (CPU), a graphics processing unit (GPU), a system on chip (SoC), etc. As shown in FIG. 1A, the memory module 30 includes several memory devices 40-X. Each memory device 40-X is an integrated circuit chip that stores data and is capable of refreshing its own data under the control of the memory controller 20. In other embodiments, the memory module 30 may include a greater or fewer number of memory devices 40-X than that shown in FIG. 1A. In one embodiment, multiple memory devices 40-X can be contained in a single package, such as in a stacked arrangement.

The signaling link 50 is used for the communication of data transfer signals 60, command and address (C/A) signals 70, and an external refresh signal 80 between the memory controller 20 and the memory devices 40-X. In one embodiment, the signals of the signaling link 50 can be conveyed from the memory controller 20 to the memory module 30 on signal lines (e.g. traces) of a motherboard. Once the signals of the signaling link 50 reach the memory module 30, they propagate to the memory devices 40-X on signal lines of the memory module 30.

The memory controller 20 transmits to and receives data from the memory devices 40-X via the data transfer signals 60. Examples of data transfer signals include data signals (DQ), data strobe signals (DQS), and data mask (DM) signals. The memory controller 20 transmits memory commands and other control information to the memory devices 40-X using the C/A signals 70. Examples of C/A signals 70 include address (ADDR) signals, bank address (BA) signals, clock (CK) signals, clock enable (CKE) signals, reset (RESET#)

signals, chip select (CS#) signals, row address strobe (RAS#) signals, column address strobe (CAS#) signals and write enable (WE#) signals.

The memory controller 20 also generates and transmits an external refresh signal 80 to the memory devices 40-X. The external refresh signal 80 includes a series of repeating external refresh events that are used by the memory controller 20 to request that the memory devices 40-X refresh their data. The memory devices 40-X receive the external refresh signal 80 and use the external refresh events to control the timing of when to refresh their data. In one embodiment, the external refresh events may be pulses of the external refresh signal 80. The external refresh events may be intermittent such that the refresh events are only generated when the memory system 10 is operating in a refresh mode, but are not generated during other non-refresh modes of operation. FIG. 1A shows an embodiment where the external refresh signal 80 is a signal that is dedicated to carrying refresh events. In other embodiments, the external refresh signal 80 may be an existing C/A signal 70, such as a CS# signal or other C/A signal 70.

In one embodiment, the memory system 10 supports a normal operating mode and a refresh mode, and the memory system 10 can switch between the two modes. During normal operating mode, the memory controller 20 can access data in the memory devices 40-X and perform other memory operations with the memory devices 40-X. The refresh mode is a low power mode, sometimes referred to as self-refresh mode, in which some of the circuitry in the memory controller 20 and memory devices 40-X is powered down to save power. During the refresh mode, the memory controller 20 may disable the CK signal and de-assert the CKE signal to indicate that the CK signal is disabled. During the refresh mode, the memory devices 40-X refresh the data stored in the memory devices 40-X at a frequency controlled by internal refresh events generated by the memory devices 40-X and at a timing controlled by the external refresh events of the external refresh signal 80.

Figure 1B:
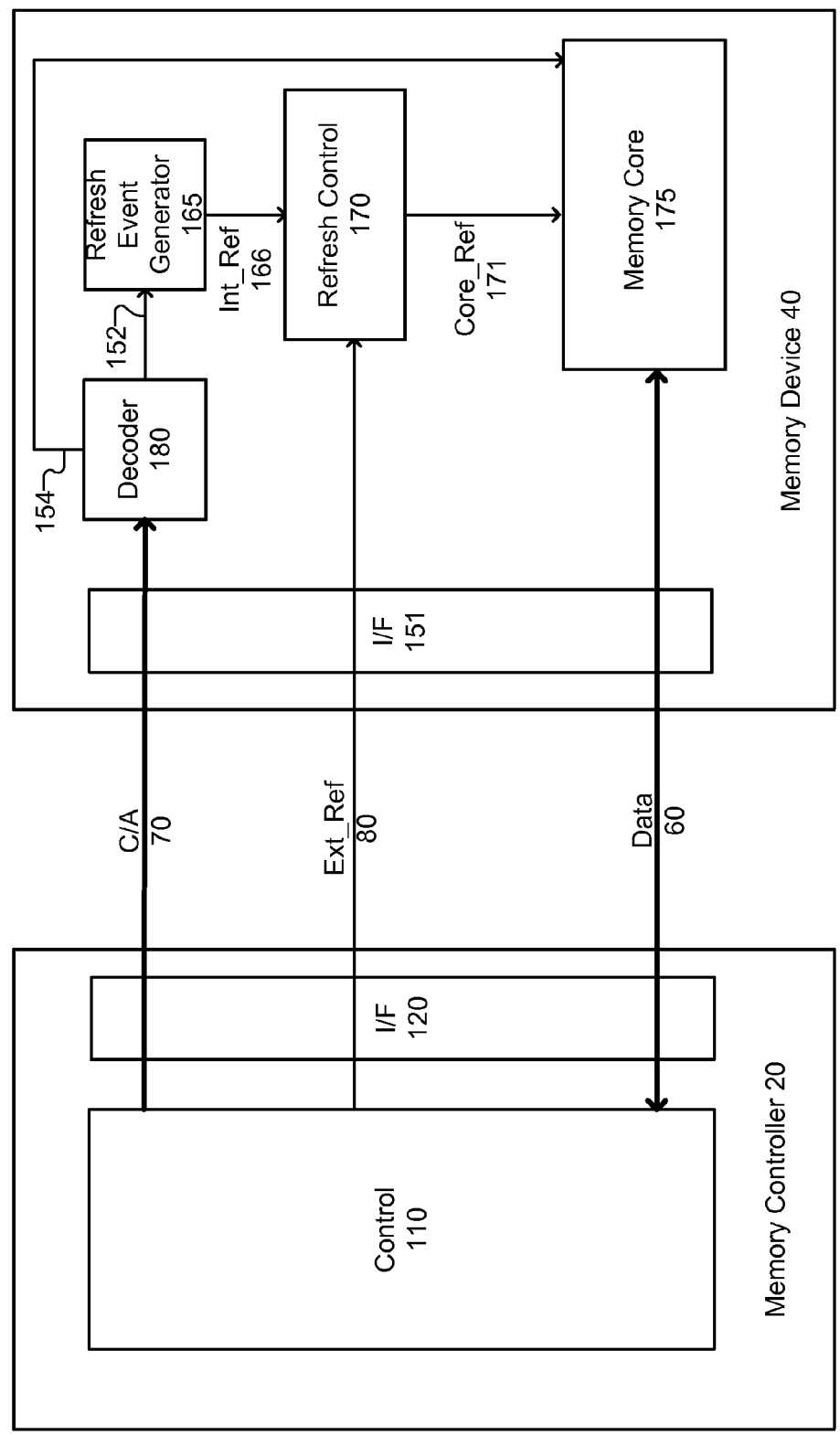
FIG. 1B is an expanded view of the memory controller and a single memory device from FIG. 1A, according to an embodiment.

FIG. 1B is a more detailed view of the memory controller 20 and a single memory device 40 from FIG. 1A, according to an embodiment. As shown, the memory device 40 includes a decoder circuit 180, a refresh event generator circuit 165, a refresh control circuit 170, a memory core 175, and an interface circuit 151. The memory device 40 may include other components or connections that are not explicitly shown in FIG. 1B.

Interface circuit 151 passes signals between the internal circuits of the memory device 40 and the memory controller 20. Interface circuit 151 receives C/A signals 70 from memory controller 20 and provides the C/A signals 70 to the decoder 180. Interface circuit 151 receives the external refresh signal 80 from memory controller 20 and provides the external refresh signal 80 to the refresh control circuit 170. The interface circuit 151 also transmits data signals 60 to the memory controller 20 during read operations and receives data signals 60 from the memory controller 20 during write operations.

Memory core 175 includes memory cells for storing data and can be organized into banks, rows and columns. In one embodiment, the memory core 175 includes dynamic random access memory (DRAM) that uses capacitors to store data in the form of electrical charges. The electrical charges dissipate over time due to leakage and other factors, and can be recharged by refreshing the memory core 175 from time to time under the control of the core refresh signal 171. In some embodiments a row counter (not shown) may store a value that points to a specific row of the memory core that is to be refreshed. Each time the core refresh signal 171 is asserted, a row of the memory core 175 selected by the row counter is refreshed and the value of the row counter is incremented. In other embodiments, the memory core 175 may include other types of memory, such as resistive random-access memory (RRAM), magnetoresistive random-access memory (MRAM), or static random access memory (SRAM).

Decoder circuit 180 decodes memory commands received from the memory controller 20. The memory commands may include an enter-refresh command for putting the memory device 40 into the refresh mode, which causes the decoder circuit 180 to assert the refresh enable signal 152 to enable the refresh event generator 165. The memory commands may also include an exit refresh command for exiting the refresh mode, which causes the decoder circuit 180 to deassert the refresh enable signal 152 to disable the internal refresh circuit 165. In other embodiments, the decoder circuit 180 may also decode other commands, such as memory access commands and configuration commands to configure the memory device 40, and control other circuits within the memory device 40 in accordance with those commands. For example, the decoder circuit 180 may control data access to the memory core 175 using signal 154.

Refresh event generator 165 generates an internal refresh signal (Int_Ref) 166 that includes internal refresh events. The internal refresh events repeat substantially periodically at an internal refresh rate (e.g., every 15.6 μs) of the memory device 40. The internal refresh rate can be set by the memory controller 20 with a configuration command that is sent to the memory device 40. The internal refresh rate may alternatively be set to a default value. The internal refresh rate can also be internally adjusted by the refresh event generator 165 to account for changing environmental parameters, such as temperature and voltage. Because the internal refresh rate can be locally adjusted by the refresh event generator 165 of each memory device 40, the internal refresh rate for each memory device 40 is optimized for the specific needs of the memory device 40, and thus at a given time different devices 40 on the same module 30 may be operating at different refresh rates.

Refresh event generator 165 may be enabled and disabled by the enable signal 152. When the refresh event generator 165 is enabled, it generates an internal refresh signal (Int_Ref) 166 that includes internal refresh events. When the refresh event generator 166 is disabled, the internal refresh signal (Int_Ref) 166 does not include any internal refresh timing events. In one embodiment, refresh event generator 165 includes an oscillator and the internal refresh events are pulses generated by the oscillator at the internal refresh rate. During the refresh mode, the oscillator may generate the internal refresh events internally on its own without using any clock signals supplied by the memory controller 20.

Refresh control circuit 170 performs refresh operations on the memory core 175 via the core refresh control signal (Core_Ref) 171 and controls a frequency and timing of when the memory core 175 is refreshed. The refresh control circuit 170 receives an external refresh signal (Ext_Ref) 80 that includes a series of external refresh events. The refresh control circuit 170 also receives an internal refresh signal (Int_Ref) 166 that includes a series of internal refresh events. The refresh control circuit 170 uses the refresh events in both of these two signals in determining whether to refresh the memory core 175 and in generating a core refresh signal (Core_Ref) 171 that causes the memory core 175 to refresh its data. As will be explained in more detail below with reference to FIGS. 3 and 4, the average frequency at which the refresh control circuit 170 performs refresh operations on the memory core 175 is limited to the frequency of the internal refresh events generated by the internal refresh signal 165, while the times at which the refresh operations are actually performed are controlled relative to the external refresh events of the external refresh signal 80.

Memory controller 20 includes a control circuit 110 and an interface circuit 120. The interface circuit 120 passes signals between the control circuit 110 and the memory device 40. The interface circuit 120 receives C/A signals and the external refresh signal 80 from the control circuit 110 and transmits these signals to the memory device 40. The interface circuit 120 also receives data signals 60 from the memory devices 40 during read operations and transmits data signals 60 to the memory device 40 during write operations.

Control circuit 110 generates various memory commands and control information that is transmitted to the memory device 40 as C/A signals 70. The memory command can include enter-refresh commands that cause the memory device 40 to enter refresh mode and also exit-refresh commands that cause the memory device 40 to exit refresh mode. During the refresh mode, control circuit 110 generates the external refresh signal 80 that includes external refresh events for triggering the refresh operations in the memory device 40. Control circuit 110 also receives read-data from and transmits write-data to the memory device 40 using data signals 60.

Figure 2:
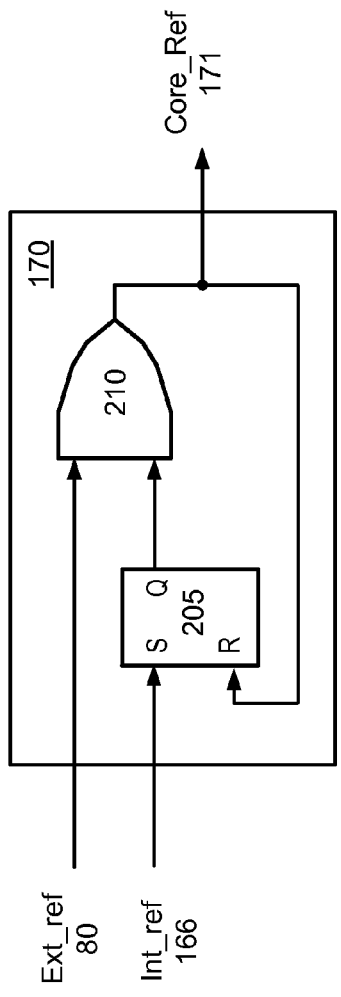
FIG. 2 is a refresh control circuit of a memory device for controlling refresh timing, according to an embodiment.

FIG. 2 illustrates a refresh control circuit 170 of a memory device 40 for controlling refresh timing, according to an embodiment. Refresh control circuit 170 includes an AND gate 210 and a refresh enable circuit in the form of set-reset (SR) flop 205. The state of the SR flop 205 indicates whether core refreshes are enabled or disabled. SR flop 205 is set to enable core refreshes whenever the internal refresh signal (Int_ref) 166 indicates an internal refresh event. The AND gate 210 receives the output of the SR flop 205 and the external refresh signal (Ext_ref) 80. The output of the AND gate 210 is the core refresh signal (Core_Ref) 171. The core refresh signal 171 is also fed back to the SR flop 205 to reset the state of the SR flop 205 to disable core refreshes whenever the external refresh signal 80 causes the core refresh signal 171 to be asserted. The detailed operation of the refresh control circuit 170 is explained in greater detail below by reference to FIG. 3.

Figure 3:
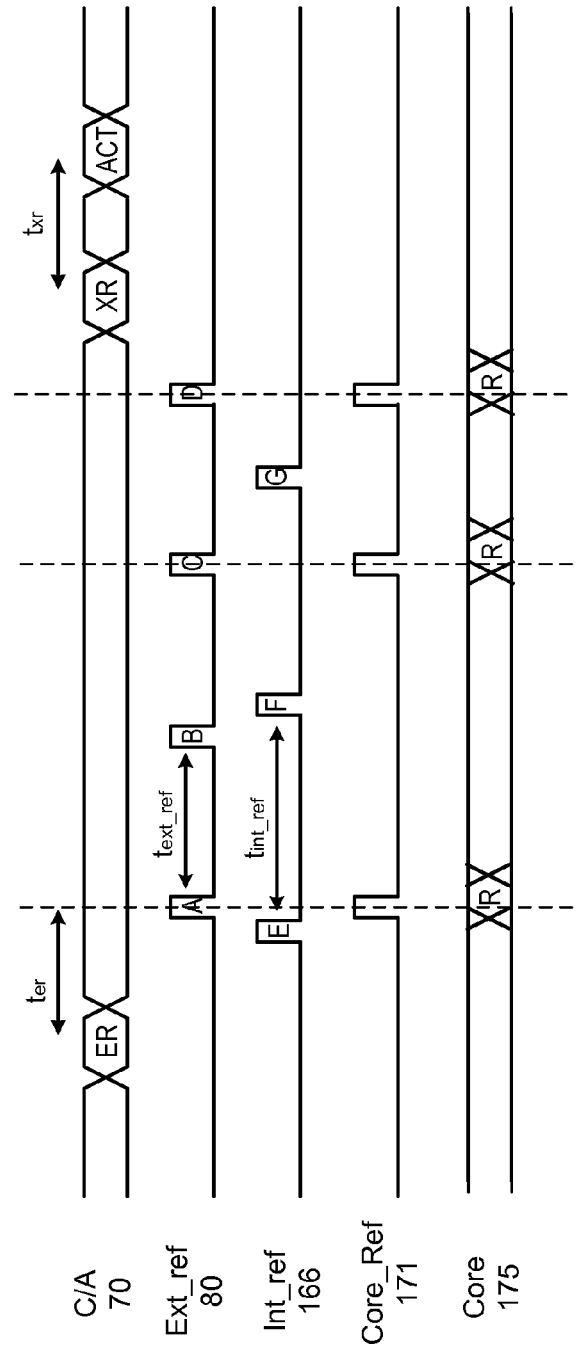
FIG. 3 is a timing diagram for controlling refresh timing of a single memory device, according to an embodiment.

FIG. 3 is a timing diagram for controlling refresh timing of a single memory device 40, according to an embodiment. Initially, the memory device 40 is in a normal operating mode. The memory controller 20 issues an enter refresh command ER using the C/A signals 70 to put the memory device 40 into refresh mode. The decoder circuit 180 receives the enter refresh command ER and prepares the memory device 40 for entering the refresh mode by enabling the refresh event generator 165. The time between when the refresh command ER is issued and the memory device 40 is ready to be refreshed is the enter refresh time ter.

The external refresh signal 80 includes a series of repeating external refresh events, shown as signal pulses A, B, C and D. The time between each external refresh event A, B, C and D is the external refresh period tem ref. In one embodiment, control circuit 110 generates external refresh events at an average rate that is faster than the internal refresh frequency of any of the memory devices, at times known to the control circuit 110. Similarly, the internal refresh signal 166 includes a serious of repeating internal refresh events, shown as signal pulses E, F and G. The time between each internal refresh event E, F and G is the internal refresh period tint ref, which corresponds to the internal refresh rate of the memory device 40, and which may be different for each memory device 40 in a memory module 30 or memory rank.

Each internal refresh event E, F and G causes the SR flop 205 to be set to enable a core refresh. Once the SR flop 205 is set, the next immediate external refresh event A, B, C and D that follows the internal refresh event E, F and G causes the core refresh signal 171 to be asserted, thereby refreshing the next refresh row or rows of the memory core 175 (the refresh operation can involve activating the row pointed to by the self-refresh counter in one or more banks, precharging the row after a refresh time, and incrementing the self-refresh counter). The assertion of the core refresh signal 171 also resets the state of the SR flop 205 to disable core refreshes. For example, internal refresh event E sets the SR flop 205 and the next immediate external refresh event A causes core refresh signal 171 to be asserted to refresh a row or rows of the memory core 175 and reset the SR flop 205. Internal refresh event F sets the SR flop 205 and external refresh event C causes core refresh signal 171 to be asserted to refresh the next row or rows of memory core 175 and reset the SR flop 205. Internal refresh event G sets the SR flop 205 and external refresh event D causes core refresh signal 171 to be asserted to refresh the next row or rows of memory core 175 and reset the SR flop 205. External refresh event B does not cause core refresh signal 171 to be asserted because SR flop 205 is reset at the time when external refresh event B is received.

The process of setting and resetting the state of the SR flop 205 continues in this manner until the memory controller 20 decides to exit refresh mode by issuing an exit refresh command XR using the C/A signals 70. The decoder circuit 180 receives the exit refresh command XR and prepares the memory device 40 for exiting the refresh mode, which can include disabling the refresh event generator 165 or performing other configuration of the circuits in the memory device 40. The time between when the exit refresh command XR is issued and the memory device 40 is ready to be accessed (e.g. by an activate ACT command) is the exit refresh time $t_{xr}$.

As shown in FIG. 3, the average frequency of the events in the external refresh signal 80 is preferably at least slightly greater than the frequency of the events in the internal refresh signal 166. Not all of the events in the external refresh signal 80 will result in a refresh of the memory core 175 in such case. For example, external refresh events A, C and D will cause the core refresh signal 171 to be asserted, but external refresh event B does not cause the core refresh signal 171 to be asserted. The refresh control circuit 170 thus limits the average frequency with which the memory core 175 is refreshed to the internal refresh rate of the memory device 40, as indicated by the internal refresh events E, F and G of the internal refresh signal 166. By limiting the average frequency of the refreshes, the memory core 175 can be refreshed no more frequently than necessary, which reduces the power consumption of the memory device.

Also, as shown in FIG. 3 the timing of the core refreshes, as indicated by the core refresh signal 171, is controlled relative to the external refresh events A, B, C and D of the external refresh signal 80. Every core refresh indicated by the core refresh signal 171 occurs at or substantially immediately after an external refresh event A, C and D following an internal refresh event E, F, and G, respectively. By controlling the timing of the refreshes with the external refresh signal 80, the memory controller 20 can precisely control when the memory core 175 is refreshed. This allows the refresh exit time $t_{xr}$ to be shortened (e.g. to 10 ns) because whether the memory core 175 is being refreshed (and how long since it was last refreshed) is always known to the memory controller 40. By contrast, if the timing of the memory refreshes were solely under the control of the memory device 40, the refresh exit time $t_{xr}$ would need to be much longer (e.g. 120 ns) to account for the possibility that the memory core 175 has just started a refresh operation when the refresh exit command XR is issued.

Figure 4:
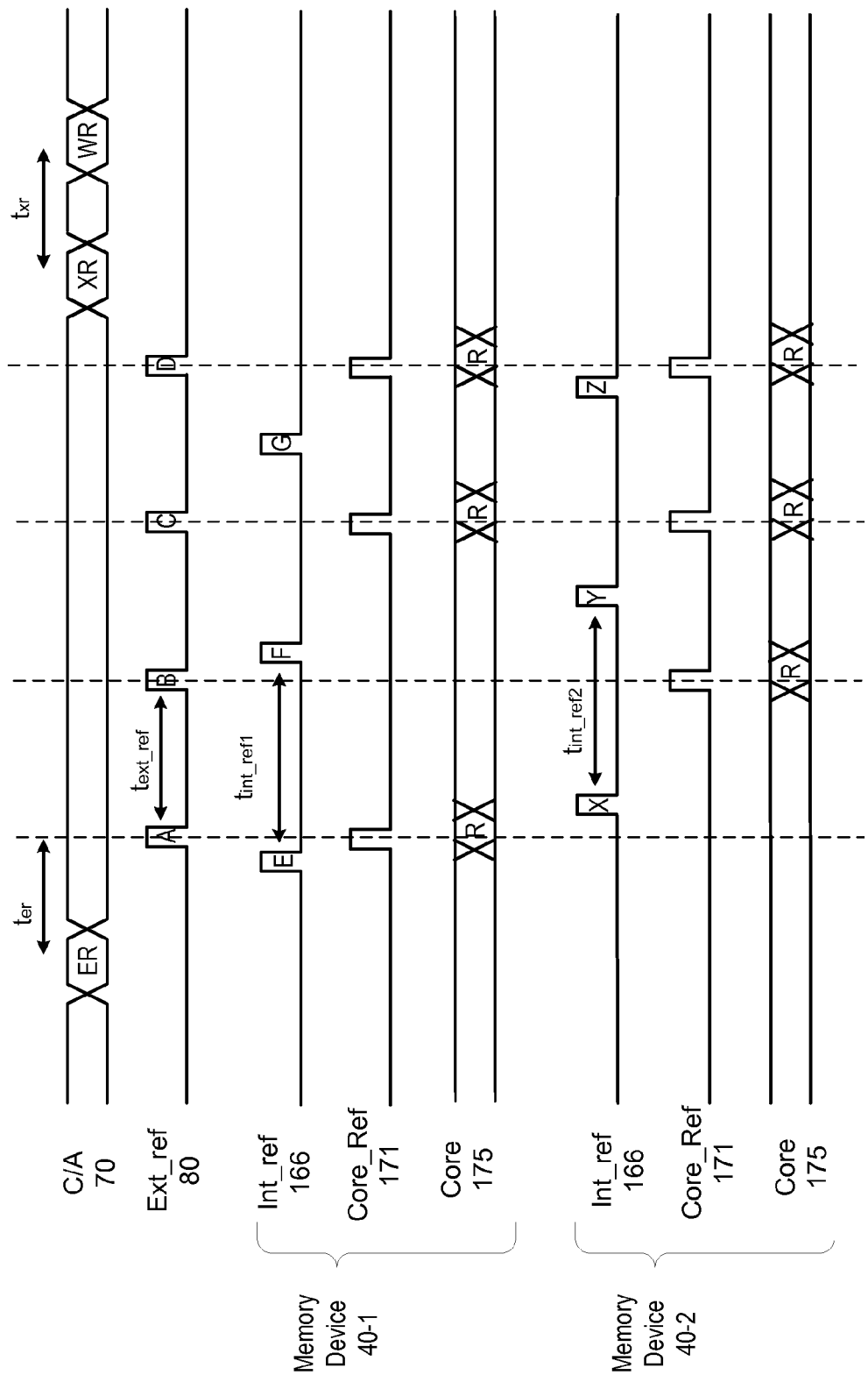
FIG. 4 is a timing diagram for controlling refresh timing of multiple memory devices, according to another embodiment.

FIG. 4 is a timing diagram for controlling refresh timing of multiple memory devices 40, according to an embodiment. FIG. 4 is similar to FIG. 3, but now includes the timing information for two memory devices 40-1 and 40-2. The timing information for memory device 40-1 is similar to the timing information shown in FIG. 3 except that the time between each internal refresh event is now indicated by internal refresh period $t_{int\_ref1}$.

Referring to memory device 40-2, the internal refresh signal 166 includes a series of repeating internal refresh events, shown as signal pulses X, Y and Z. The time between each internal refresh event X, Y and Z is the internal refresh period $t_{int\_ref2}$. Memory device 40-1 and memory device 40-2 have separate refresh event generators 165 that are independent and not synchronized with each other. The internal refresh period $t_{int\_ref1}$ for memory device 40-1 may be different than the internal refresh period $t_{int\_ref2}$ for memory device 40-2 due to differences between refresh event generators 165 of the two memory devices 40-1 and 40-2 and or other localized parameters (such as the sensed temperature of each device 40-1 and 40-2). As a result, the internal refresh events E, F and G for memory device 40-1 may occur at different times than the internal refresh events X, Y and Z for memory device 40-2.

Despite the differences in the refresh event generators 165, both memory devices 40-1 and 40-2 still use the external refresh events A, B, C and D to control the timing of their respective core refreshes. For memory device 40-1, the refresh control circuit 170 asserts the core refresh signal 171 in response to external refresh events A, C and D that follow the internal refresh events E, F, and G, respectively. For memory device 40-2, the refresh control circuit 170 asserts the core refresh signal 171 in response to external refresh events B, C and D that follow the internal refresh events X, Y, and Z, respectively. Thus, memory controller 20 uses a single external refresh signal 80 to synchronously control the actual core refresh timing for both memory devices 40-1 and 40-2 of the memory module 30. By synchronizing the core refresh timing across an entire memory module 30 or rank thereof, the refresh exit time $t_{xr}$ for the entire memory module 30 can be shortened (e.g. to 10 ns).

Figure 5:
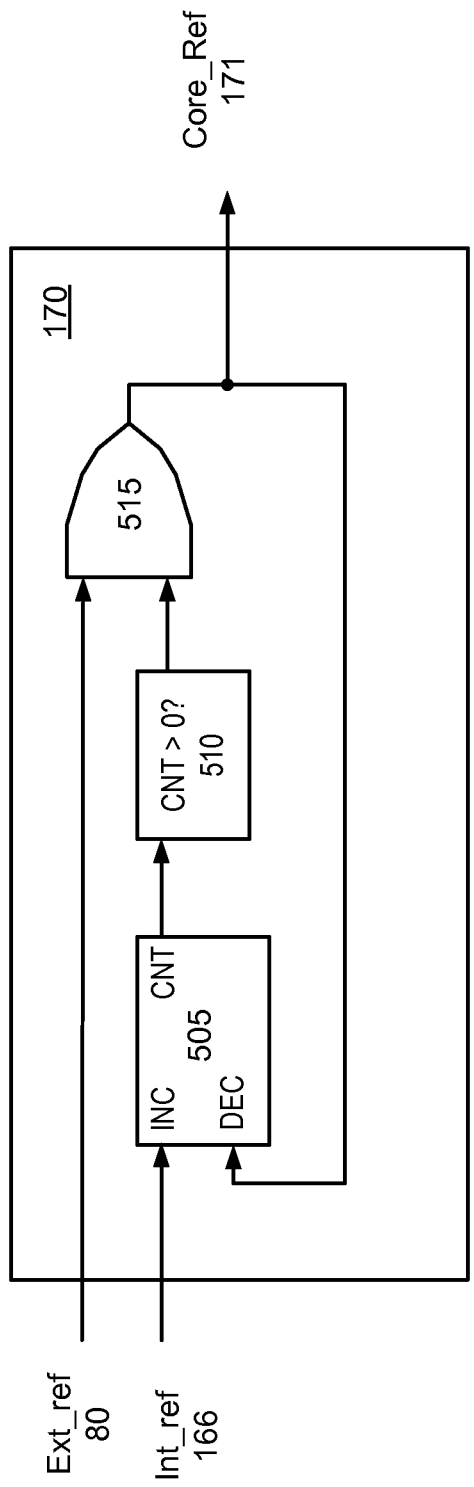
FIG. 5 is a refresh control circuit of a memory device for controlling refresh timing, according to another embodiment.

FIG. 5 is a refresh circuit 170 of a memory device 40 for controlling refresh timing, according to another embodiment. FIG. 5 is similar to FIG. 2 but now includes a counter 505 and a counter evaluation circuit 510 instead of a SR flop 205. The value of the counter 505 tracks a number of internal refresh events that are pending. If the value of the counter is zero, it indicates that no refreshes are queued and so refreshes are disabled. If the value of the counter is greater than one, it indicates that some refreshes are queued and so refreshes are enabled.

The counter 505 increments when receiving an internal refresh event and decrements when receiving an external refresh event and the count is greater than zero. Specifically, the counter 505 increments its value by 1 whenever the internal refresh signal 166 includes an internal refresh event to increase the number of refreshes that are queued. The counter evaluation block 510 outputs a logical 0 if the value of the counter 505 is 0, and outputs a logical 1 if the value of the counter 505 is greater than 0. The AND gate 515 asserts the core refresh control signal 171 to refresh the memory core 175 upon receiving an external refresh event, assuming that the value of the counter 505 is greater than 0. The assertion of the core refresh signal 171 also decrements the value of the counter 505 by 1 to decrease the number of refreshes that are queued.

The refresh control circuit 170 of FIG. 5 allows for several refreshes to be queued and then performed as a burst of refreshes. For example, the memory controller 20 can delay issuing external refresh events for a period of time to build up a queue of pending refreshes in the counter 505. The memory controller 20 can then send a burst of external refresh events via the external refresh signal 80 to clear out the queued refreshes to prepare the memory device 40 for exiting the refresh mode. Burst refreshes allow refresh control circuit 170 to support more than one refresh operation between adjacent internal refresh events.

Figure 6:
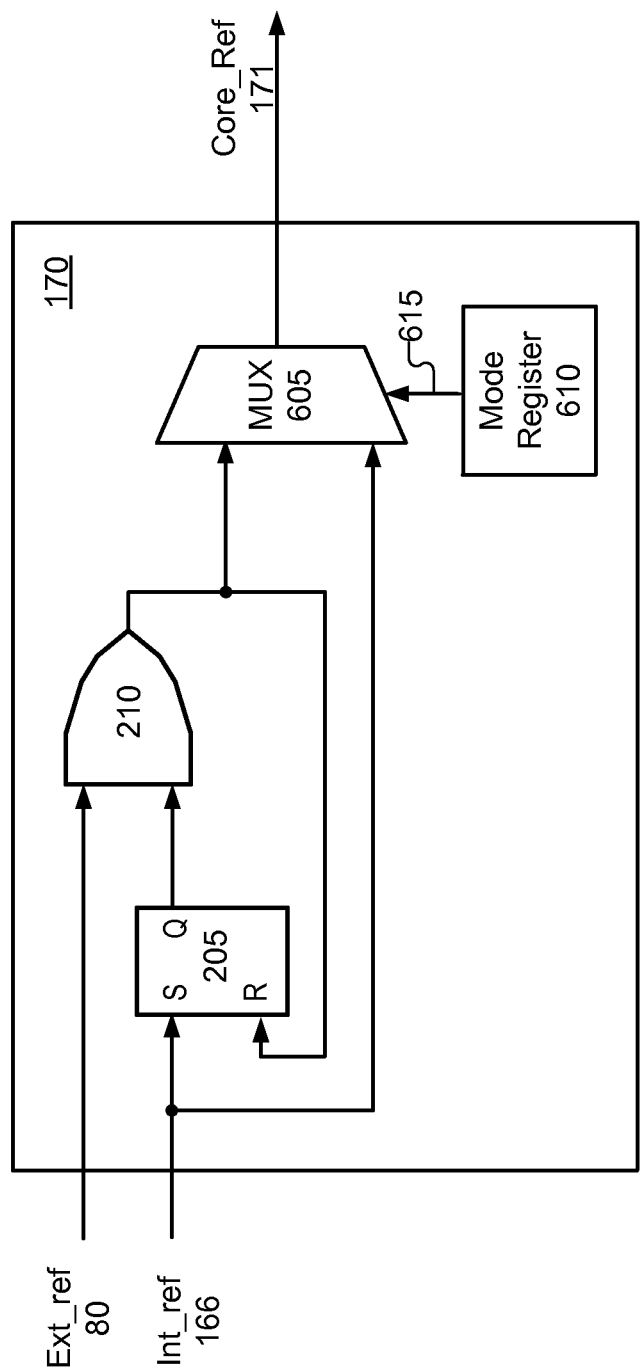
FIG. 6 is a refresh control circuit of a memory device for controlling refresh timing that supports different types of refresh modes, according to an embodiment.

FIG. 6 is a refresh control circuit 170 of a memory device 40 for controlling refresh timing that supports different types of refresh modes, according to still another embodiment. The refresh control circuit 170 of FIG. 6 is similar to the refresh control circuit 170 of FIG. 2, but now includes a multiplexer (MUX) 605 and a mode type circuit in the form of a mode register 610.

The mode register 610 stores information indicating the type of refresh mode that the memory device is to operate in. For example, a mode register 610 value of "0" indicates that the memory device 40 is to operate in an externally timed refresh mode that uses the internal refresh signal 166 to control the frequency of the core refreshes and the external refresh signal 80 to control the precise timing of the core refreshes. On the other hand, a mode register 610 setting of "1" indicates that the memory device 40 is to operate in an internally timed refresh mode that uses the internal refresh signal 166 to control both the frequency and the timing of the core refreshes without regard for the external refresh signal 80.

Specifically, when the mode register 610 is set for operating in the externally timed refresh mode, the mode register 610 generates a MUX control signal 615 that causes the MUX 605 to select the output of the AND gate 210 as the core refresh signal 171. When the mode register 610 is set for operating in the internally timed refresh mode, the mode register generates a MUX control signal that causes the MUX 605 to select the internal refresh signal 210 as the core refresh signal 171 while bypassing the AND gate 210 and SR flop 205.

In one embodiment, the memory controller 20 may generate a configuration command that indicates a type of refresh mode that the memory device 40 will be operated in. This configuration command may be generated one time when the memory system 10 is first powered on to configure the memory device 40. The decoder circuit 180 decodes the configuration command and sets the mode register 610 in accordance with the type of refresh mode indicated by the configuration command. In one embodiment, the default setting for the mode register 610 may be for the internally timed refresh mode if no configuration command is received. Beneficially, supporting dual modes of operation allows the memory device 40 to be used with memory controllers 20 that support the externally timed refresh mode, as well as memory controllers 20 that do not support the externally timed refresh mode.

In other embodiments, the mode register 610 may be located outside of the refresh control circuit 170. In other embodiments, the multiplexer 605 and mode register 610 of FIG. 6 may also used in conjunction with the refresh control circuit 170 of FIG. 5.

Figure 7:
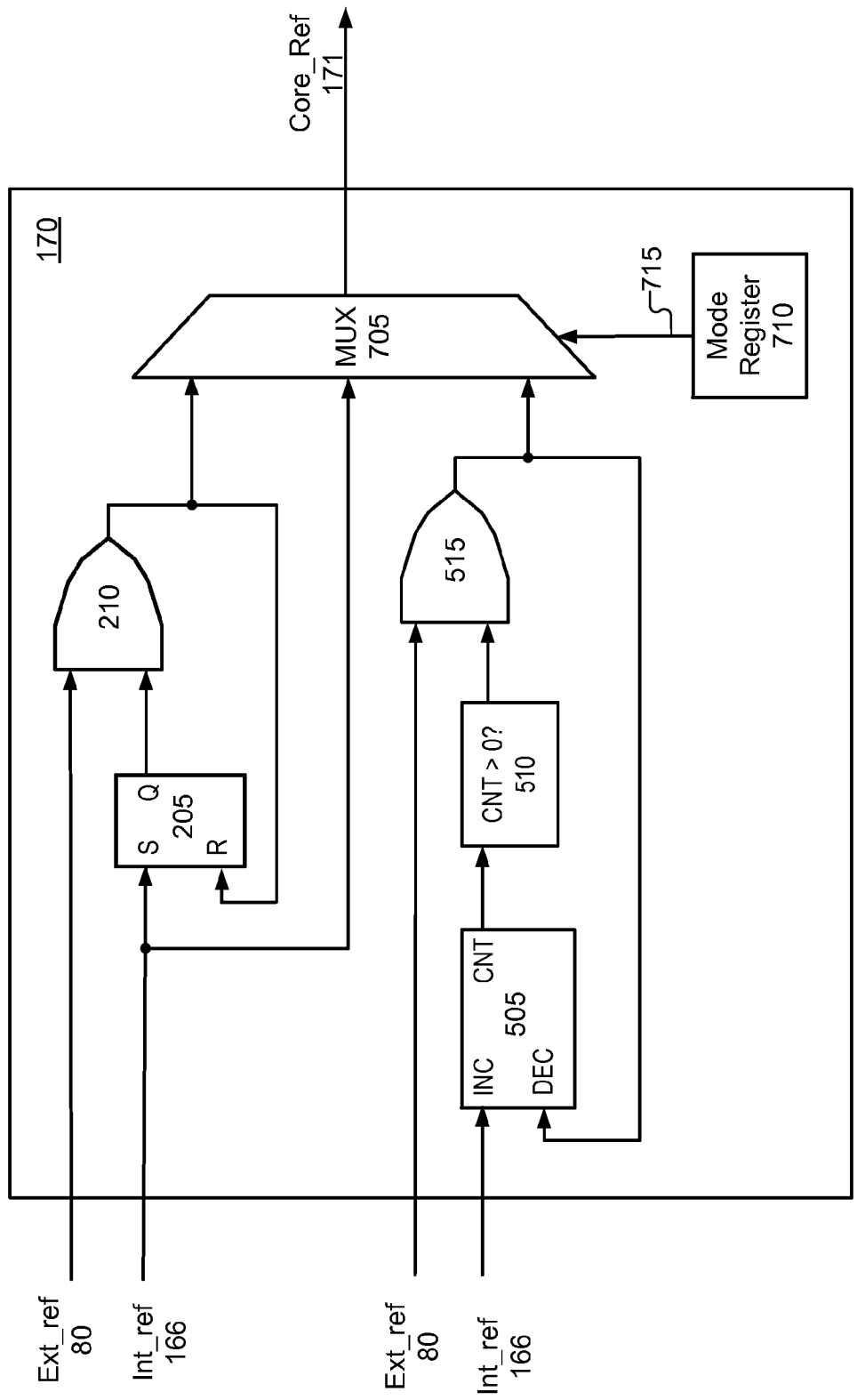
FIG. 7 is a refresh control circuit of a memory device for controlling refresh timing that supports different types of refresh modes, according to still another embodiment.

FIG. 7 is a refresh control circuit 170 of a memory device 40 for controlling refresh timing that supports different types of refresh modes, according to still another embodiment. The refresh control circuit 170 of FIG. 7 is similar to the refresh control circuit 170 of FIG. 6, but now includes additional circuitry (e.g. 505, 510, 515) that supports the burst refresh mode described in conjunction with FIG. 5.

The mode register 710 stores information indicating the type of refresh mode that the memory device is to operate in. The mode register 710 supports three different types of refresh modes: internally timed refresh mode, externally timed refresh mode, and externally timed burst refresh mode. If the information indicates that the internally timed refresh mode is activated, the output 715 of the mode register 710 causes the MUX 705 to select the internal refresh signal 166 as the core refresh signal 171. If the information indicates that the externally timed refresh mode is activated, the output 615 of the mode register 710 causes the MUX 705 to select the output of the AND gate 210 as the core refresh signal 171. If the information indicates that externally timed burst refresh mode is activated, the output 715 of the mode register 710 causes the MUX 705 to select the output of the AND gate 515 as the core refresh signal 171. As previously described, burst refreshes allow refresh control circuit 170 to support more than one refresh operation between adjacent internal refresh events.

Embodiments of the disclosed memory system 10 thus control the timing of refreshes in memory devices 40 using external refresh events, while controlling an average frequency of the refreshes using internal refresh events that are generated by the memory device 40. As a result, the refresh exit time can be reduced while also limiting the power consumption of the memory devices 40 when the memory devices 40 are in refresh mode.

Upon reading this disclosure, those of skill in the art may appreciate still additional alternative designs for improved refresh in a memory system. Although modules have been used in exemplary embodiments, the concepts described herein apply equally to other non-modular memory systems having refresh power modes. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. An integrated circuit memory device, comprising:
a memory core;
an interface circuit to receive an external refresh signal indicating an intermittent refresh event;
a refresh circuit to generate an internal refresh signal indicating an internal refresh event of the memory device; and
a refresh control circuit to cause a refresh operation to be performed on a portion of the memory core, the refresh control circuit enabling core refresh responsive to the internal refresh event and waiting until the intermittent refresh event indicated by the external refresh signal to trigger the refresh operation once core refresh is enabled by the internal refresh event.

2. The integrated circuit memory device of claim 1, wherein:
the external refresh signal indicates a plurality of intermittent refresh events,
the internal refresh signal indicates a plurality of internal refresh events, and
the refresh control circuit causes refresh operations to be performed on respective portions of the memory core for each of the plurality of internal refresh events, the control circuit enabling core refresh responsive to the internal refresh events and triggering each refresh operation responsive to a respective one of the intermittent refresh events indicated by the external refresh signal that next follows a respective one of the internal refresh events once core refresh is enabled.

3. The integrated circuit memory device of claim 2, wherein the refresh circuit generates the internal refresh signal to indicate the internal refresh events at an internal refresh rate of the memory device.

4. The integrated circuit memory device of claim 2, wherein intermittent refresh events indicated by the external refresh signal are more frequent than the internal refresh events indicated by the internal refresh signal.

5. The integrated circuit memory device of claim 4, wherein the refresh control circuit does not perform refresh operations in response to at least some of the intermittent refresh events indicated by the external refresh signal.

6. The integrated circuit memory device of claim 1, wherein the refresh control circuit comprises:
a circuit having a state that is set to enable core refresh responsive to the internal refresh event and is reset to disable core refresh responsive to the intermittent refresh event indicated by the external refresh signal.

7. The integrated circuit memory device of claim 1, wherein the refresh control circuit comprises:
a refresh counter that stores a value indicating a number of queued refreshes, the refresh counter increasing the number of queued refreshes responsive to the internal refresh event and decreasing the number of queued refreshes responsive to the intermittent refresh event indicated by the external refresh signal, and
wherein the refresh control circuit enables core refresh responsive to the value stored by the refresh counter indicating an existence of queued refreshes.

8. The integrated circuit memory device of claim 1, further comprising:
a mode type circuit storing information indicating whether the memory device is to operate in a first type of refresh mode or a second type of refresh mode supported by the memory device,
wherein responsive to the information indicating the first type of refresh mode, the refresh control circuit the refresh control circuit uses the internal refresh event to enable core refresh and waits until the intermittent refresh event indicated by the external refresh signal to trigger the refresh operation once core refresh is enabled, and
wherein responsive to the information indicating the second type of refresh mode, the refresh control circuit triggers the refresh operation using the internal refresh event.

9. The integrated circuit memory device of claim 1, further comprising:
a mode type circuit storing information indicating whether the memory device is to operate in a first type of refresh mode or a second type of refresh mode supported by the memory device,
wherein responsive to the information indicating the first type of refresh mode, the refresh control circuit is configured to support only one refresh operation between adjacent internal refresh events, wherein responsive to the information indicating the second type of refresh mode, the refresh control circuit is configured to support more than one refresh operation between adjacent internal refresh events.

10. A method of operation in an integrated circuit memory device that includes a memory core, the method comprising:
receiving an external refresh signal indicating an intermittent refresh event;
generating an internal refresh signal indicating an internal refresh event of the memory device; and
performing a refresh operation on a portion of the memory core, wherein performing the refresh operation comprises:
enabling core refresh responsive to the internal refresh event; and
waiting until the intermitted refresh event indicated by the external refresh signal to trigger the refresh operation once core refresh is enabled by the internal refresh event.

11. The method of claim 10, wherein the external refresh signal indicates a plurality of intermittent refresh events, the internal refresh signal indicates a plurality of internal refresh events, and performing the refresh operation comprises performing a plurality of refresh operations by:
enabling core refresh responsive to the internal refresh events; and
triggering each refresh operation responsive to a respective one of the intermittent refresh events indicated by the external refresh signal that next follows a respective one of the internal refresh events once core refresh is enabled.

12. The method of claim 11, wherein generating the internal refresh signal comprises generating the internal refresh signal indicating the internal refresh events at an internal refresh rate of the memory device.

13. The method of claim 11, wherein the intermittent refresh events indicated by the external refresh signal are more frequent than the internal refresh events indicated by the internal refresh signal.

14. The method of claim 13, wherein refresh operations are not performed in response to at least some of the intermittent refresh events indicated by the external refresh signal.

15. The method of claim 10, wherein performing the refresh operation comprises:
setting a circuit state to enable core refreshes responsive to the internal refresh event;
resetting the circuit state to disable core refreshes responsive to the intermittent refresh event indicated by the external refresh signal.

16. The method of claim 10, wherein performing the refresh operation comprises:
increasing a number of queued refreshes responsive to the internal refresh event;
enabling core refresh responsive to the number of queued refreshes indicating an existence of queued refreshes;
decreasing the number of queued refreshes responsive to the intermittent refresh event indicated by the external refresh signal.

17. The method of claim 10, further comprising:
storing information indicating whether the memory device is to operate in a first type of refresh mode or a second type of refresh mode supported by the memory device,
wherein performing the refresh operation comprises:
responsive to the information indicating the first type of refresh mode, enabling core refresh responsive to the internal refresh event and waiting until the intermittent refresh event indicated by the external refresh signal to trigger the refresh operation once core refresh is enabled, and
responsive to the information indicating the second type of refresh mode, triggering the refresh operation using the internal refresh event.

18. The method of claim 10, further comprising:
storing information indicating whether the memory device is to operate in a first type of refresh mode or a second type of refresh mode supported by the memory device,
wherein responsive to the information indicating the first type of refresh mode, configuring the memory device to support only one refresh operation between adjacent internal refresh events,
wherein responsive to the information indicating the second type of refresh mode, configuring the memory device to support more than one refresh operation between adjacent internal refresh events.

* * * * *